(12) United States Patent
Lesso

(10) Patent No.: US 7,583,774 B2
(45) Date of Patent: *Sep. 1, 2009

(54) CLOCK SYNCHRONISER

(75) Inventor: Paul Lesso, Edinburgh (GB)

(73) Assignee: Wolfson Microelectronics plc, Edinburgh (GB)

( * ) Notice: Subject to any disclaimer, the term of this patent is extended or adjusted under 35 U.S.C. 154(b) by 537 days.

This patent is subject to a terminal disclaimer.

(21) Appl. No.: 10/986,994

(22) Filed: Nov. 15, 2004

(65) Prior Publication Data

US 2005/0281367 A1    Dec. 22, 2005

(30) Foreign Application Priority Data

Dec. 17, 2003 (GB) ................................. 0329233.1

(51) Int. Cl.
*H03D 3/18* (2006.01)
(52) U.S. Cl. .................. 375/377; 375/376; 375/371; 375/373; 375/354; 375/372; 370/504; 714/12; 714/10; 714/16; 714/17; 455/1; 327/105; 327/147
(58) Field of Classification Search .......... 375/372, 375/377, 371, 354, 373, 376; 370/504; 714/12; 331/1, 10, 16, 17; 455/260; 327/105, 147
See application file for complete search history.

(56) References Cited

U.S. PATENT DOCUMENTS

| 5,486,792 | A | 1/1996 | Girardeau, Jr. |
| 6,504,437 | B1 | 1/2003 | Nelson et al. |
| 6,658,074 | B1 | 12/2003 | Murakami |
| 6,711,227 | B1 * | 3/2004 | Kaylani et al. ............... 375/327 |

(Continued)

FOREIGN PATENT DOCUMENTS

CN    1320301 A    10/2001

(Continued)

OTHER PUBLICATIONS

Ian C. Purdie, Crystall Oscillator, 2000-2002, VK2TIP of WWW. electronics-tutorials.com/oscillators/crystal-oscillators.htm, pp. 1-4.*

*Primary Examiner*—Shuwang Liu
*Assistant Examiner*—Helene Tayong
(74) *Attorney, Agent, or Firm*—Dickstein Shapiro LLP

(57) ABSTRACT

A clock synchronizer, for generating a local clock signal synchronized to a received clock signal, is described and claimed, along with a corresponding clock synchronization method. The clock synchronizer incorporates a reference oscillator providing a reference signal, and a synthesizer circuit arranged to synthesize a local clock signal from the reference signal. The synthesizer circuit comprises a phase-locked-loop circuit, including a phase detector receiving the reference signal, and a controllable divider arranged in a feedback path from a controlled oscillator to the phase detector, the divider being controllable to set a frequency division value N along the path to determine a ratio of the local clock frequency to the reference frequency. The clock synchronizer also incorporates a clock comparison circuit adapted to generate a digital signal indicative of an asynchronism between the local and remote clock signals. A control link is arranged to link the clock comparison circuit to the divider. This link receives the digital signal and provides a control signal to the divider to adjust the frequency division value N according to the digital signal, to alter the local clock frequency and reduce the asynchronism. Preferably, the clock comparison circuit compares the periods of the local and received clock signals.

54 Claims, 5 Drawing Sheets

U.S. PATENT DOCUMENTS

| | | | |
|---|---|---|---|
| 2002/0075980 A1* | 6/2002 | Tang et al. | 375/372 |
| 2004/0252800 A1* | 12/2004 | Kota et al. | 375/354 |
| 2005/0207480 A1* | 9/2005 | Norsworthy et al. | 375/217 |

FOREIGN PATENT DOCUMENTS

| | | |
|---|---|---|
| CN | 1347591 A | 5/2002 |
| CN | 1417949 A | 5/2003 |
| JP | 8335932 | 12/1996 |
| JP | 2001-68997 | 3/2001 |
| KR | 2003 028603 | 4/2003 |
| WO | WO 00/62428 A2 | 10/2000 |
| WO | WO 01/11783 A1 | 2/2001 |
| WO | WO 2004/088845 | 10/2004 |

* cited by examiner

CLOCK SYNCHRONISER

FIELD OF THE INVENTION

This invention relates to clock synchronisers, i.e. systems for synchronising a local and remote clock.

BACKGROUND TO THE INVENTION

FIG. 1 shows a digital data link comprising a transmitter and a receiver being clocked by respective phase-locked-loop circuits (PLLs). The transmitter transmits data at a given transmit clock rate and the receiver clocks the data in using its local clock. However the two clock frequencies may not be exactly the same. Both crystals 11 will have a frequency error (typically up to 500 ppm) and there may also be an error in the frequency generated by the PLL at either end. For example, both PLLs may be fractional-N PLLs (known circuits, able to synthesise output signals having frequencies which are non-integer multiples of the reference frequency) provided with the same input frequency (i.e. the same reference signal) but having subtly different divider ratios. The output frequencies of the PLLs may both meet a specified minimum and maximum frequency range, although they are in fact slightly different. Even a few ppm difference on, say, a 12 MHz data stream could give missing bits several times a second, which would be completely unacceptable for both digital audio data or indeed more general data streams. So, in many systems it is desirable to have a capability to synchronise a locally generated clock and a remotely generated clock. For example it is desirable to generate a clean clock locally and retime the incoming data to this clock prior to a digital-to-analogue converter to avoid clock-jitter induced noise and distortion. The local clock and the incoming data clock would need synchronising to avoid data loss. Synchronised clocks also prevent buffer under/over run in data receivers.

The clocking information can either be sent from transmitter to receiver as a separate signal channel, or embedded in the data stream. However, even in the first case, the clock may have been corrupted by the time it reaches the receiver. Cross-talk onto the clock channel from data channels, extraneous noise and interference, and jitter added by the transmit buffer compounded by frequency attenuation from cables or other forms of distortion in a more general communication channel can all degrade the spectral purity of the received clock. In the absence, for economy or channel bandwidth reasons, of a separate clock channel, the received clock must be derived from the received data: this generally also adds extra received clock jitter from both data-dependent sources such as inter-symbol interference and from non-idealities in the clock extraction circuitry In many applications, such as high-resolution audio data converters, the spectral purity of the clock can be limiting factor for THD (total harmonic distortion) and SNR (signal-to-noise ratio). To this end the received clock usually needs to have the jitter attenuated to improve performance of the receiving device.

There is a subtle distinction between the remote clock, i.e. the clock as observable at the transmitter, and the received clock, i.e. the clock observable at the receiver. The long-term average frequency of the two is equal, so if a local clock is synchronised to the received clock, it is also synchronised to the remote clock. However, it is the received clock, with additional short-term jitter as described above, which is actually used in any signal processing at the receiver, so the receiver must also attenuate this undesirable jitter.

One method of solving the problem of data loss due to remote and local clocks slipping past each other involves the use of an elastic buffer. An elastic buffer is a buffer that is used to hold enough data to ensure that when the clocks beat no data is lost. However the size of elastic buffer can be large for extremely jittery clocks and one buffer is required for each channel of data. For multiple channel systems the size of the elastic buffer can become the dominating issue To address the problem of minimising the jitter on the local clock, traditionally clock synchronisers have been implemented by using analogue phase locked loops, with large off-chip components necessary to provide low-frequency time-constants to filter out the jitter on the reference clock. In practice, two PLLs may be needed, one with wide enough bandwidth to track the incoming clock and recover the data and another PLL with low bandwidth used to reduce the amount of jitter on the recovered clock.

Off-chip components increase the cost and physical size of the design. They can also degrade the performance unless great care is exercised. "Ground bounce" or transient differences between the ground off- and on-chip due to wideband ground return currents flowing through the chip ground connections are inevitable and can possibly even introduce more jitter than the loop filter is attenuating from the remote clock.

There is thus a need for a system that can generate a clock that is the same frequency as an incoming data clock (i.e. a received clock), but with substantially less jitter than that of the data clock as received. Preferably this clock synchroniser should be low-cost, and require a minimum of external components. Also, to reduce the amount of hardware in multi-channel systems it is generally preferable to synchronise to one clock common to all channels rather than to the data on each channel.

SUMMARY OF THE INVENTION

According to a first aspect of the present invention there is provided a clock synchroniser, for generating a local clock signal synchronised to a received clock signal, comprising:

a reference oscillator arranged to provide a reference signal having a reference frequency;

a synthesiser circuit arranged to synthesise (i.e. generate) a local clock signal from the reference signal, the synthesiser circuit comprising a phase-locked-loop circuit including a phase detector, having a first input arranged to receive the reference signal, and a controllable divider arranged in a feedback path (which may also be referred to as a feedback loop) from a controlled oscillator to a second input of the phase detector, the divider being controllable to set a frequency division value N along said path to determine a ratio of the local clock frequency to the reference frequency;

a clock comparison circuit arranged to receive the local clock signal and a received clock signal, and adapted to generate a first digital signal indicative of an asynchronism between the local and received clock signals; and a control link (connection, path, circuit) linking the clock comparison circuit to the divider and arranged to receive the first digital signal and to provide a control signal to the divider to adjust the frequency division value N according to the first digital signal to alter the local clock frequency and thus reduce the asynchronism.

In certain preferred embodiments the first digital signal is indicative of an accumulated clock slippage, i.e. a slippage between the local and received clock signals.

It will be appreciated that the clock comparison circuit may also be described as an asynchronism detector. The detected asynchronism may be a difference in period or frequency and/or a phase difference. Preferably, the first digital signal is indicative of a period difference between the clocks, and the divider is then controlled to reduce the period difference, resulting in a steady-state condition where the frequency of the local clock has converged to that of the received clock, and consequently to the frequency of the remote clock, i.e. the clocks are then synchronised.

The clock comparison circuit may, for example, be adapted to generate the first digital signal by comparing the phase of the clocks (i.e. detecting a phase difference), by comparing their frequencies (i.e. detecting a frequency difference), or by comparing periods (pulse lengths) (i.e. detecting a difference in periods, that difference being indicative of a frequency difference between the clocks).

The value N is the factor by which the divider divides an input signal, i.e. it is the ratio of the respective frequencies of the signals at the divider input and output. It will be appreciated that the phase detector in the synthesiser may also be described as a phase comparator, and that the frequency detector used in the clock comparison circuit of certain embodiments may be termed a frequency comparator.

Similarly, the clock comparison circuit may comprise a period comparator, the first digital signal being indicative of a difference in periods, and hence of a frequency difference. Similarly the clock comparison circuit may comprise a phase comparator, the first digital signal then being indicative of a phase difference.

It will also be apparent that, in addition to the controlled oscillator, phase detector and divider, the PLL circuit will comprise some means for controlling the controlled oscillator (to set its output frequency) according to the output from the phase detector.

The clock comparison circuit and the control link may together be referred to as a divider control circuit.

This clock synchroniser provides the advantage that it is able to generate a low jitter local clock signal from the reference signal, synchronised with the received clock which may comprise a high level of jitter. The combination of synthesiser, clock comparison circuit, and control link acting to reduce the asynchronism, may be regarded as a control loop. Jitter on the received clock is, in effect, decoupled from the local clock signal by the fact that this control loop has a low bandwidth, so the long-term average of the reference and local clock frequencies become equal, but higher frequency jitter components fall outside the bandwidth of the loop so do not pass through to the local clock. This low loop bandwidth is advantageously achieved by using digital means in the control path which adjusts the divider value (also known as the divider ratio) according to detected asynchronism (preferably a period difference). The use of digital means allows signals to be stored or integrated for long times without needing large-value analog components to achieve long time constants. Typically this digital means is a simple integrator to convert the detected asynchronism to a measure of slippage between the clocks.

Since the local clock frequency is locked to the received clock frequency, it is also locked to the remote clock frequency.

Preferably the reference oscillator is a local oscillator.

The control signal may comprise the first digital signal, or may be derived from the first digital signal, such that the control signal is dependent on the first digital signal. The control signal determines, at least partially, the frequency division value set by the divider.

Clearly, the type of divider circuit used will determine what control signal or signals are required to achieve a particular division value or ratio. The control link is configured to generate and apply the appropriate control to the divider, to achieve the change in division ratio required by the detected asynchronism (such as a frequency discrepancy). Control of the divider is such that the local and received clock frequencies converge.

The control link may, in certain embodiments, be a simple connection, conveying the first digital signal to the divider. In such embodiments, the divider itself must incorporate circuitry to implement the required N change. In alternative embodiments, the control link may comprise a control circuit with a plurality of components, adapted to process the first digital signal (e.g. a digital frequency error signal) and provide a suitable control signal.

Preferably, the divider is a digitally controlled divider, and the control signal from the control link comprises at least one digital control signal (the divider may require a plurality of control signals to achieve a desired N value, especially for non-integer values). For example, the digital control signal may comprise the first digital signal, such that the divider is supplied with a number indicative of a frequency error to be countered.

The control link may comprise an adder arranged to add the first digital signal (or a signal derived from it) to a second digital signal, the digital control to the divider signal being dependent on the sum of these first and second signals. Thus, the second digital signal may represent a base value for N, and the first signal may represent an adjustment.

In certain embodiments, the control link may comprise a sigma-delta modulator arranged to receive an output signal from the adder or directly from the digital filter if an adder is not explicit in the implementation and generate the divider control signal.

The control link may comprise one or more digital filters in the control path from the output of the clock comparator to the divider. Preferably this filter is a simple integrator, or counter acting as an integrator.

Preferably, the reference oscillator comprises a crystal oscillator. This arrangement is able to generate a reference signal with inherently low jitter, which can in turn be used to generate a low-jitter local clock.

Preferably, the controlled oscillator is a voltage controlled oscillator (VCO), although current-controlled and numerically-controlled oscillators (ICOs and NCOs) could be used in certain embodiments. Use of an NCO in particular would, however, increase the complexity of the circuit, requiring a greater number of components.

Preferably, the phase detector is a digital phase detector, arranged to provide a digital phase signal dependent on a phase difference between the signals at its first and second inputs. Conveniently, it may be a phase and frequency detector (PFD).

A particular preferred embodiment utilises a digital phase detector and a VCO in the PLL, the PLL further comprising a filter and a charge pump, the charge pump being controlled by the digital phase signal to supply current to the filter, and the filter being arranged to integrate the supplied current to provide a control voltage to the voltage controlled oscillator.

Preferably, the phase locked loop circuit is a fractional-N phase locked loop circuit, the divider being controllable to achieve a non-integer average value of N. Fractional-N PLLs are known in the art. For example, they may utilise dividers having internal circuitry that enables the value of N to change dynamically during the locked state. Dual modulus dividers may be used, which can change N between two values during a cycle (e.g. between P and P+1, where P is an integer), the relative portions of the cycle for each value determining the average N value. Tri- and quad-modulus dividers are also known, enabling the N value to be controllably switched between 3 and 4 different values respectively.

In certain preferred embodiments, the divider is arranged to divide an output signal from the controlled oscillator (CO) and to provide the divided signal to the second input of the phase detector (i.e. the divider may be connected directly between the CO output and the PD input). In alternative embodiments, there may be additional circuit elements arranged between the controllable divider and the CO and/or the PD.

The synthesiser circuit may consist of the PLL circuit, or alternatively may comprise additional components. For example, it may comprise at least one further divider arranged to divide an output signal from the phase-locked-loop circuit to produce the local clock signal.

In certain preferred embodiments the clock comparison circuit may comprise a clock period comparator circuit adapted to compare period lengths of the local and received clock signals and output a digital clock period signal indicative of a difference in clock periods, and hence of a frequency difference between the clock signals. This clock period comparator circuit may include a first counter arranged to receive the local clock signal, and a second counter arranged to receive the received clock signal, the first and second counters each being further provided with a common clock signal having a frequency higher than the local clock signal. Conveniently, the common clock signal is provided from the phase-locked-loop circuit, and preferably is a signal divided from the output signal of the controlled oscillator (the frequency of the undivided CO output may be unnecessarily high for this counter-clocking purpose; the higher the clock frequency the larger the counters must be). At the end of each clock cycle, the respective counter stores the count value reached, while starting the count for the next clock cycle. The period comparator circuit then further comprises a comparator arranged to generate a digital output signal indicative of the relative magnitude of the two counter output values. The control link may comprise a digital filter to integrate the clock period signal (or a signal derived from it) to deliver an output which is indicative of an accumulated slippage between the two clocks (local and received). Cycle-by-cycle variation of this slippage corresponds to relative jitter of these two clocks. Alternatively, the comparator output signal may be indicative of only the sign of the difference between the two counter values, in which case a simple counter will suffice the integrate the comparator output signal to yield an approximation to the accumulated slippage.

The clock comparison circuit may comprise a frequency detection circuit instead of a clock period comparator circuit, providing a digital signal corresponding to a frequency difference between the local and received clocks. One form of frequency detection circuit, suitable for use in embodiments of the invention, comprises a cycle comparator circuit arranged to compare respective numbers of local and received clock cycles in a common time interval to provide an indication of frequency difference. For small relative deviations in frequency, this detected frequency difference may be scaled and then integrated similarly to an approximately equivalent period difference as above to provide an approximate measure of the accumulated slippage.

In other preferred embodiments the clock comparison circuit comprises a clock phase detector arranged to generate a clock phase signal indicative of a phase difference between the local and remote clock signals, and a digital filter arranged to average said clock phase signal (or a signal derived from it) to provide an indication of relative slippage between said clock signals. In this case, the digital filter will preferably have at least one zero as well as at least one pole to achieve good loop stability. The clock phase detector is preferably a digital phase detector (such as a PFD circuit) and the clock phase signal is a digital signal In all of the above embodiments the control link may also include a gain block to scale the digital clock phase signal and provide the scaled signal to the filter (e.g. to increment or decrement the counter). Also, the control link may comprise a gain block arranged to scale the filter output (e.g. counter value).

In certain preferred embodiments, the control link is adapted to control the divider to set an initial frequency division value (after a system reset, for example). This may be achieved by using a rate detector arranged to generate a digital rate signal indicative of an approximate value of the received clock frequency, the control link being arranged to set the initial frequency division ratio according to this digital rate signal. Additionally, the control link may comprises a memory storing data indicative of respective N values appropriate for a plurality of possible received clock frequencies. After a system reset, the control link circuitry can select data according to the digital rate signal and set the initial frequency division value according to the selected data. This enables the system to achieve synchronisation with the remote clock more rapidly.

In such embodiments, the rate detector is arranged to receive the received clock signal and a further clock signal, conveniently derived from the reference oscillator.

The clock synchroniser may further comprise a clock extractor circuit, arranged to receive a data signal containing a clock signal, and adapted to extract the clock signal and provide it to the clock comparison circuit as the received clock signal.

A second aspect of the invention provides a clock synchroniser, for generating a local clock signal synchronised to a received clock signal, comprising:

a local oscillator;

a phase-locked-loop circuit arranged to generate a local clock signal using the local oscillator as a reference, the phase-locked-loop circuit including a controllable divider arranged in a feedback loop to control a ratio of the local clock frequency to the local oscillator frequency; and a divider control circuit, including a clock comparison circuit arranged to receive the local clock signal and a received clock signal and adapted to generate a digital signal indicative of an asynchronism between the local and received clock signals, the divider control circuit being adapted to control the divider according to the digital signal to adjust the local clock frequency to reduce the asynchronism.

The digital signal may be indicative of a period or frequency and/or a phase difference. The digital signal may be indicative of a slippage between the clocks.

Advantageously, the phase-locked-loop circuit and the digital frequency-locked-loop circuit share a common controlled oscillator, which is preferably a VCO.

Another aspect of the invention provides a digital audio device comprising a clock synchroniser in accordance with any one of the above-mentioned aspects, the clock synchroniser being arranged to generate a local clock signal synchronised to a received clock signal embedded in a digital audio signal.

Another aspect provides a method of generating a local clock signal synchronised to a received clock signal, the method comprising the steps of:

generating a reference signal using a local oscillator;

synthesising a local clock signal from the reference signal using a phase-locked-loop circuit including a controllable divider arranged in a feedback loop to control a ratio of the local clock frequency to the reference frequency;

generating a digital signal indicative of an asynchronism between the local clock signal and a received clock signal; and using the digital signal to control the divider to adjust the local clock frequency to reduce the asynchronism.

Preferably, the digital signal is indicative of a slippage between the clock signals, and the divider is controlled to reduce the frequency difference between the clock signals to reduce the slippage.

Other objects and advantages of the present invention will become apparent from the following description.

BRIEF DESCRIPTION OF THE FIGURES

Embodiments of the invention will now be described with reference to the accompany drawings, by way of example only and without intending to be limiting, of which.

DETAILED DESCRIPTION OF THE PREFERRED EMBODIMENTS

Figure 1:
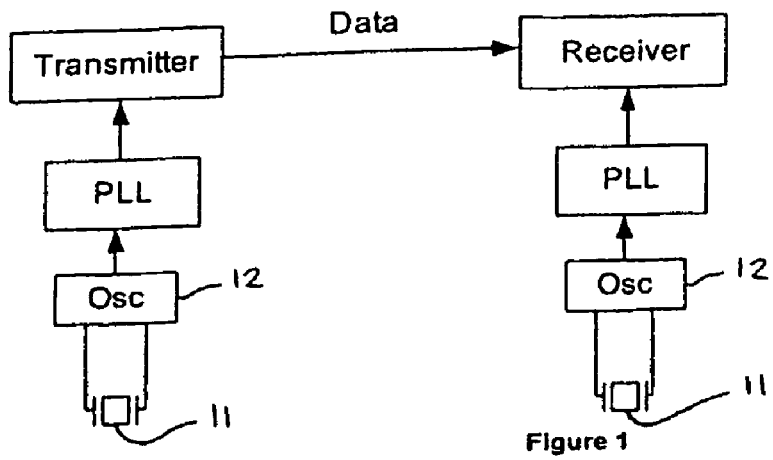
FIG. 1 is a schematic representation of a data transmit and receive system in accordance with the prior art.
Figure 2:
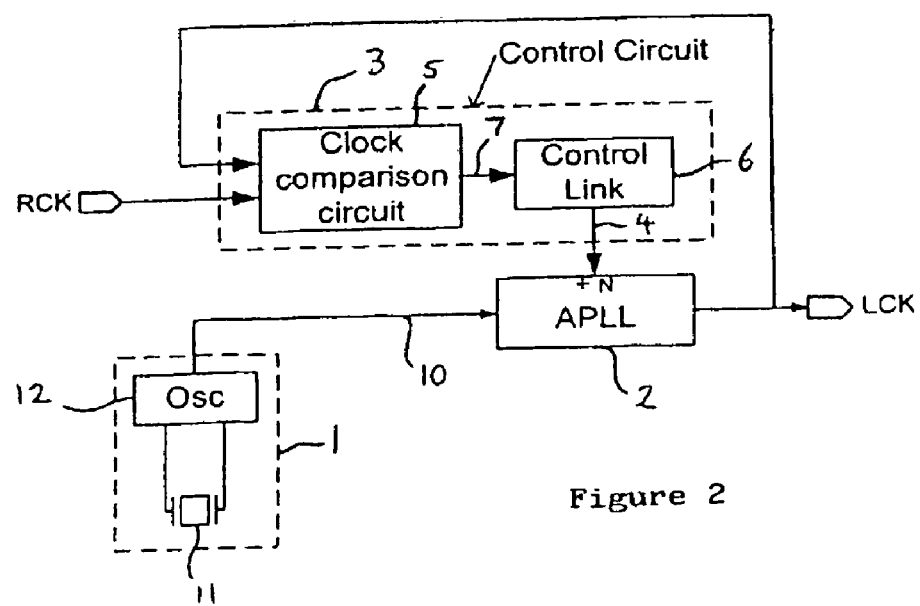
FIG. 2 is a schematic diagram of a clock synchroniser embodying the invention.

Referring now to FIG. 2, this shows a dual loop clock synchroniser embodying the invention. This synchroniser comprises two blocks: an analogue phase locked loop 2 (APLL) which generates a low jitter local clock LCK; and a control circuit 3.

The APLL synthesises the local clock, of frequency $f_{LCK}$, from a reference signal 10, of frequency $f_{ref}$ generated by the reference oscillator 1, which incorporates the local crystal 11 and oscillator circuitry 12. The APLL includes a controllable divider circuit in the feedback path from its output clock to its input phase detector which sets the ratio of $f_{ref}$ to $f_{LCK}$ according to $f_{LCK}=f_{ref}*N$ where N is the divider ratio.

The control circuit 3 includes a clock comparison circuit 5 which compares a received clock RCK and the local clock LCK and generates a digital signal 7 indicative of any asynchronism between them, and a control link 6 which conditions this indicative asynchronism signal 7 to provide a digital control signal 4 to the APLL. This digital control signal 4 is applied to a controllable divider in the APLL, which is arranged to adjust the division ratio N in the feedback path of the APLL to adjust $f_{LCK}$, so as to bring the frequencies of the clock signals LCK and RCK together.

As regards the APLL, it is often desirable to have the VCO frequency running faster than needed and dividing that clock down to the desired rate to achieve a low phase noise. For r.f. applications the divider ratio is often large, and adequate frequency resolution may be obtained with an integer divider ratio. But more commonly, a non-integer divider ratio is needed to provide adequate frequency resolution.

Thus, certain embodiments of the present invention use a fractional-N PLL so that the output frequency of the PLL can be adjusted to the resolution to which N can be specified. For example a resolution of 22 bits for N will allow the frequency to be adjusted to 1 part in $2^{\wedge}24$, corresponding to a beat frequency of once every 92 minutes for a 48 kHz clock. In practice the frequency will tend to hunt between the two (or maybe a few) closest increments in N: the resolution of N should be high enough so that the resulting jitter is small compared to the output jitter due to other sources.

The combination of divider control circuit 3 (i.e. clock comparison circuit and control link) and APLL 2 may be considered to implement a digital frequency-locked loop (DFLL). To prevent jitter passing from the remote clock to the local clock the DFLL is designed with a low loop bandwidth. Input jitter components within this bandwidth will pass through the DFLL, as will long-term clock frequency variations. However, jitter components above a certain frequency are attenuated. For audio applications this corner frequency is arranged to be below 200 Hz, to prevent clock jitter components in the audio band from producing signal distortion when used to reconstruct the analogue audio signal in a DAC, for example.

The low loop bandwidth of the DFLL is achieved using digital filtering in the loop instead of the large off chip filter components a dual analogue PLL approach would use. The physical size of these components is a problem especially in portable systems. The use of digital techniques also allows the frequency above which jitter is attenuated to be pushed significantly lower than would be practical using off chip components. Component values would be constrained by on- and off-chip leakage currents compared to the low-value on-chip current sources, and the thermal noise of high-impedance components contributing to PLL output noise/jitter. In cost sensitive designs the cost reduction of not using off chip components and improving performance is a significant advantage over traditional approaches.

From the above description of FIG. 2, it will be apparent that in certain embodiments of the invention the control circuit comprises a clock comparison circuit controlling the APLL divider with a suitably arranged control link. The clock comparison circuit in certain embodiments comprises a period detection circuit. In other embodiments it may comprise a frequency detector, or a phase detector. Different filtering is required to obtain loop stability and to define the desired low loop bandwidth to provide jitter attenuation for each case.

As analysed later, this control circuit block eventually typically delivers an output which is indicative (albeit loosely in some examples) of the accumulated slippage between the two clocks, rather than the instantaneous frequency, period or phase difference between the local and received clocks. This accumulated slippage or asynchronism may also be regarded as a measure of jitter between the most recent corresponding chosen edges of the two clocks. Preferably this measure is not subject to any frequency weighting or attenuation: it is the loop gain of the whole loop which provides attenuation of medium and high frequency jitter between the received clock and the local clock.

Figure 3:
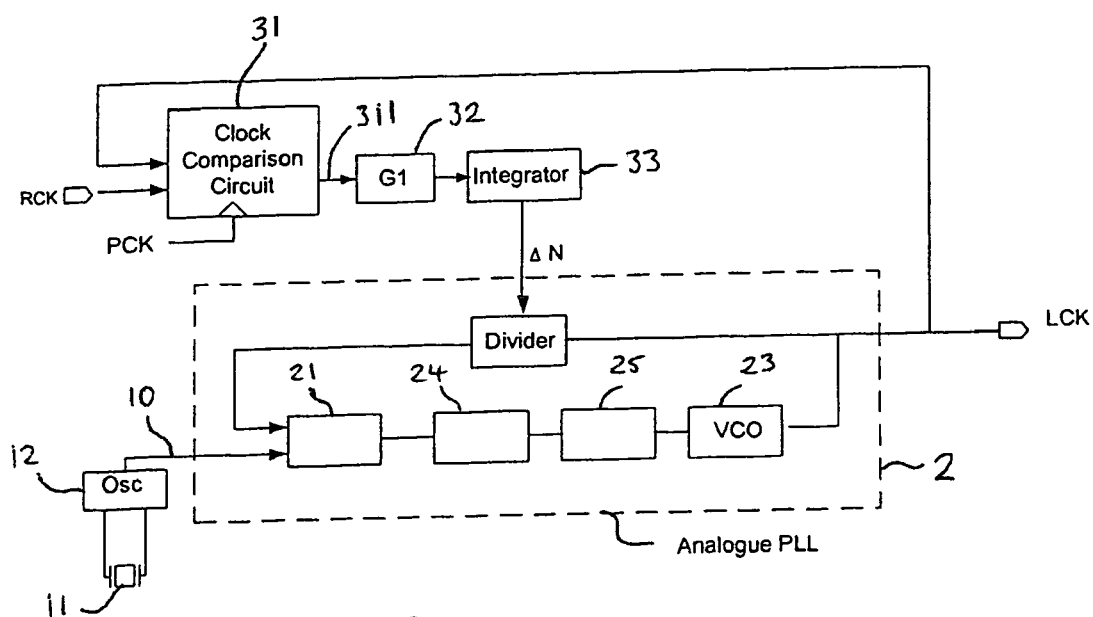
FIG. 3 is a schematic diagram of another clock synchroniser embodying the invention.
Figure 7:
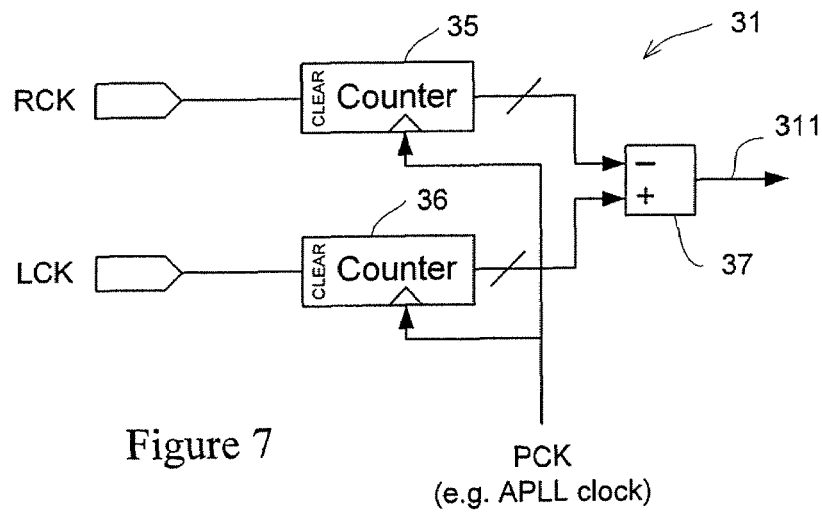
FIG. 7 illustrates a circuit which can be used in embodiments to provide an indication of period difference, and hence frequency difference, between local and received clocks.

FIG. 3 shows another embodiment of the invention. This clock synchroniser comprises a clock comparison circuit 31 which compares the locally generated clock LCK with the received clock RCK. The clock comparison circuit 31 can be implemented in a variety of ways to give different measures of asynchronism. A possible implementation is shown in FIG. 7. This circuit is a period detector. This circuit uses two counters 35, 36 that hold their count value reached when the clear signal is asserted. These counters can be clocked by a clock PCK from the APLL, or some other convenient source. The counter values each represent the duration, in units of PCK period, $T_{PCK}$, of the respective input clock, and are compared by a comparator 37 which outputs a digital signal 311 indicative of the relative pulse lengths of the RCK and LCK signals, and hence also indicative of a period difference between the local and remote clocks.

Looking at the circuits of FIG. 7 and FIG. 3, this generates a positive output 311 if the received clock is running faster and a negative output if the local clock is running faster. This output signal 311 can be regarded as a measure of the period error of the two clocks. The signal 311 is a digital number $\Delta n$. This is scaled by a gain block 32 of gain $G_1$ and input to an integrator 33 integrating the detected period difference to give a digital number representing the slippage between the clocks in units of $T_{PCK}/G_1$. In the circuit of FIG. 3, this digital number is supplied direct to the divider, as a digital control signal $\Delta N$. In other embodiments, such as that shown in FIG. 4, the digital number from the integrator 33 may be scaled by another gain block 34 with associated gain $G_2$ (typically dividing by a power of two, i.e. a bit-shift, for hardware simplicity) to give a number $\Delta N$ which is then added (using an adder 41) to the nominal divider value, N, for the PLL.

This system has a transfer function, T, from the input to N which can be derived in the following manner:

The output frequency of the system is given by $$f_{LCK} = f_{vco} = (N + \Delta N) f_{ref}$$

where $f_{ref}$ is the frequency of the reference clock, in this case that of the crystal oscillator 12. So to first order, the small-signal transfer function of the APLL is $$T_{APLL} = \delta f_{LCK}/\delta \Delta N = f_{ref} = f_{LCK}/N$$

It is assumed that the dominant pole in the APLL is at least one decade higher than the open loop unity gain frequency of the overall DFLL to ensure stability The period detector determines the period difference:

$$\Delta n = f_{PCK} * \{(1/f_{LCK}) - (1/f_{RCK})\}$$

If $f_{LCK}$ is approximately equal to $f_{RCK}$, and $f_{PCK}/f_{LCK} = M$, say, this approximates to $$\Delta n = M \frac{f_{RCK} - f_{LCK}}{f_{LCK}} \text{ or}$$

$$\Delta n = T_{FD}[f_{RCK} - f_{LCK}]$$

Where $T_{FD} = M/f_{LCK}$ can be considered a small-signal transfer function $\delta \Delta n / \delta F_{LCK}$ of this block And the digital filter, in this case a simple integrator, operates upon $\Delta n$ (possibly gained by a value G1) to give a number $\Delta N$ (representing the clock slippage or the jitter between corresponding clock edges):

$$\Delta N = G_1 \cdot \Delta n \frac{z}{z - 1}$$

Hence we can define the transfer function of the digital filter as:

$$T_{FILTER} = G_1 \cdot \frac{z}{z - 1}$$

Hence the open loop transfer function is given by $$T_{open.loop} = T_{APLL} T_{FD} T_{FILTER}$$

$$T_{open.loop} = \frac{f_{LCK}}{N} \frac{M}{f_{LCK}} G_1 \frac{z}{z - 1}$$

$$T_{open.loop} = \frac{M \cdot G_1}{N} \frac{z}{z - 1}$$

Which leads to the closed loop transfer function from RCK to LCK of $$T_{closed.loop} = \frac{\frac{M}{N} \cdot G_1 \cdot z}{z\left(1 + \frac{M}{N} \cdot G_1\right) - 1}$$

G1 can be used to dynamically adjust the bandwidth. For this system the cut-off frequency of the control loop is approximately given by $$f = \left| \frac{\log_e\left(\frac{1}{1 + \frac{M}{N} G_1}\right)}{2\pi \cdot T_{PCK}} \right|$$

where $T_{PCK}$ is the period of PCK. For a PCK of 48 kHz, M/N=1, and a G1 of $$\frac{1}{2^{10}},$$

a bandwidth of 3 Hz is obtained.

Note the loop bandwidth gain can be temporarily increased, to increase the loop bandwidth and hence reduce lock times, on start-up or re-acquisition, by increasing the gain term $G_1$.

Figure 8:
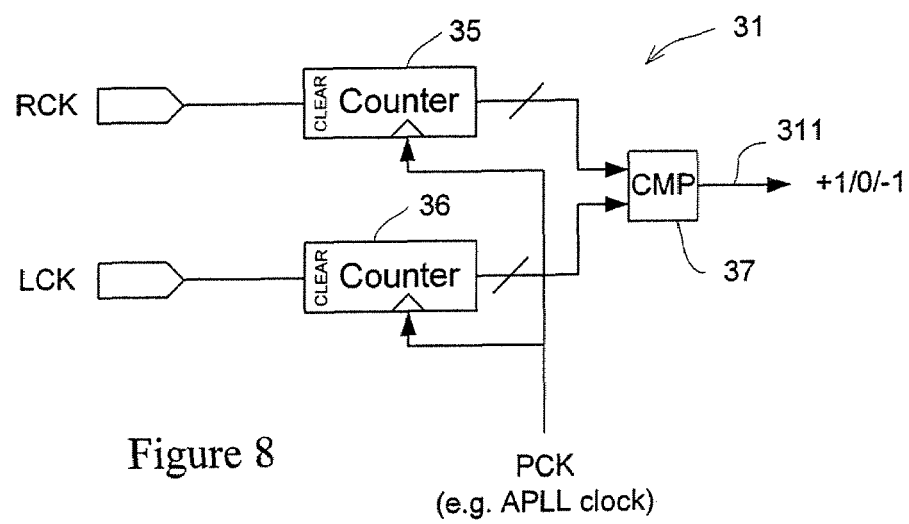
FIG. 8 illustrates an alternative circuit which can be used in embodiments to provide an indication of period difference between local and received clocks.

Although the circuit of FIG. 3 employed a clock comparison circuit in the form of a period detector, giving a multi-bit digital output, other implementations are possible for the detector. One additional form of clock comparison circuit is shown in FIG. 8 and represents a variant of that shown in FIG. 7. The circuit of FIG. 8 outputs a digital signal 311 which represents the difference between the two counters as just 1, 0 or −1 rather than a multi-bit word. In this case the integrator 33 can be replaced by a simple counter, which is incremented, unchanged, or decremented according to whether the output is +1, 0, or −1 respectively. This implementation provides adequate performance with significantly less hardware or calculation complexity.

Figure 9:
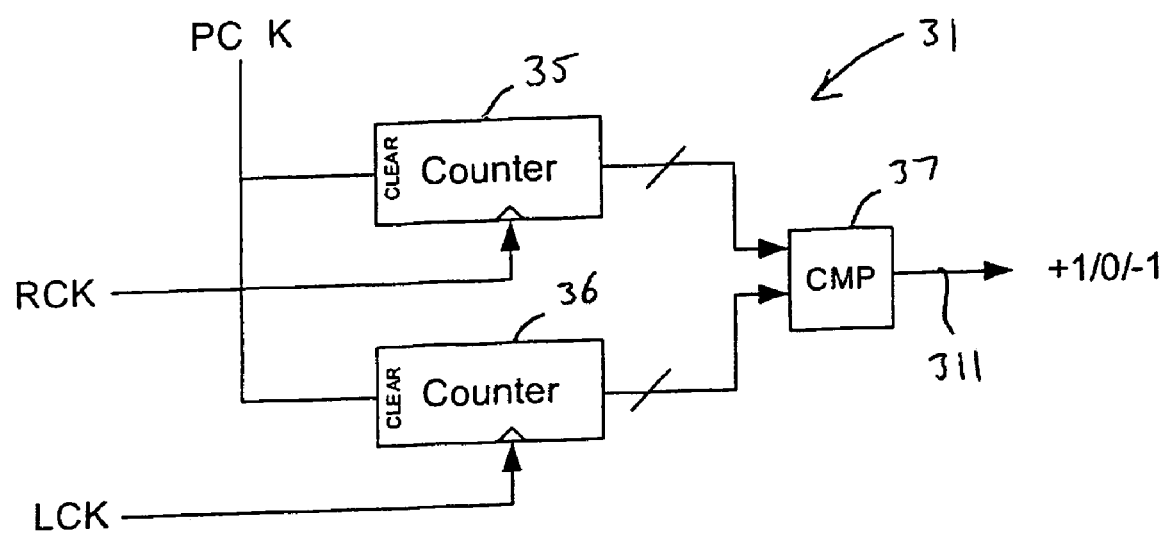
FIG. 9 illustrates another circuit which can be used in embodiments to provide an indication of frequency difference between local and received clocks.

Another suitable clock comparison circuit is shown in FIG. 9. This circuit counts the number of LCK and RCK cycles during each cycle of a relatively low frequency PCK and thus acts as a frequency detector. This could be followed within the frequency detection circuit by a simple integrator, or more complex filter if desired.

Figure 6:
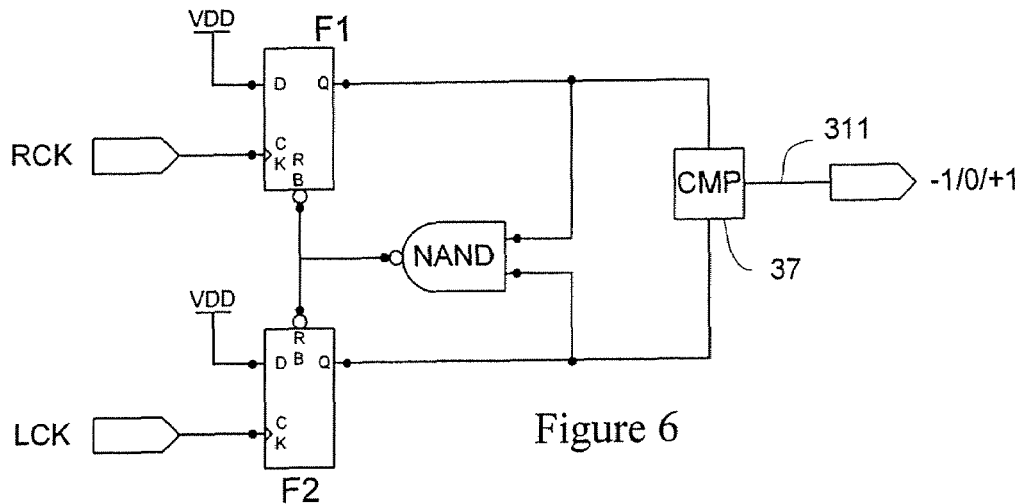
FIG. 6 illustrates a phase detector/comparator suitable for use in embodiments of the invention.

Another clock comparison circuit for use in embodiments of the invention is shown in FIG. 6. This is the well known phase and frequency detector (PFD) circuit widely used in modern APLL designs. In this case the phase detection already implies an integration of the input frequency difference in the loop, so the digital filter included in the whole frequency detection circuit would typically include one pole and one zero, rather than being a pure integrator. The pole would smooth high-frequency ripple, the zero would ensure stability near the low closed-loop frequency.

Implementations using these alternative clock comparison circuits can be analysed mathematically similarly to the above.

In principle, by increasing the resolution of N, an arbitrarily exact clock synchronisation could be achieved. However the APLL will itself introduce some jitter to the local clock through noise and other imperfections. APLL jitter components of frequency less than the DFLL loop bandwidth will be attenuated in the same way as remote clock jitter. But if the jitter of the APLL, measured over interval of less than the order of the DFLL time-constant, is of the order of a clock period, then this APLL short term jitter will negate any advantages of the DFLL control loop, i.e. edges of the local clock may still slip past edges of the remote clock.

In other words the APLL loop must be designed so that $$\int_{BW}^{\infty} S_\theta df \ll T_{LCK}$$

where $S_\theta$ is the power spectral density of the APLL output, BW is the bandwidth of the DFLL and $T_{LCK}$ is the local clock period. In practice BW is small, so the integral approximates the integral from 0 to infinity, i.e. the full integrated jitter of the APLL. PLLs can easily be designed to give long term jitter will be less than 1ns. This easily satisfies the above constraint for audio applications, where the clock frequency will be a few MHz at most, but may be a limit for higher-data-rate links, where more care and expertise would be required in the PLL design.

Figure 4:
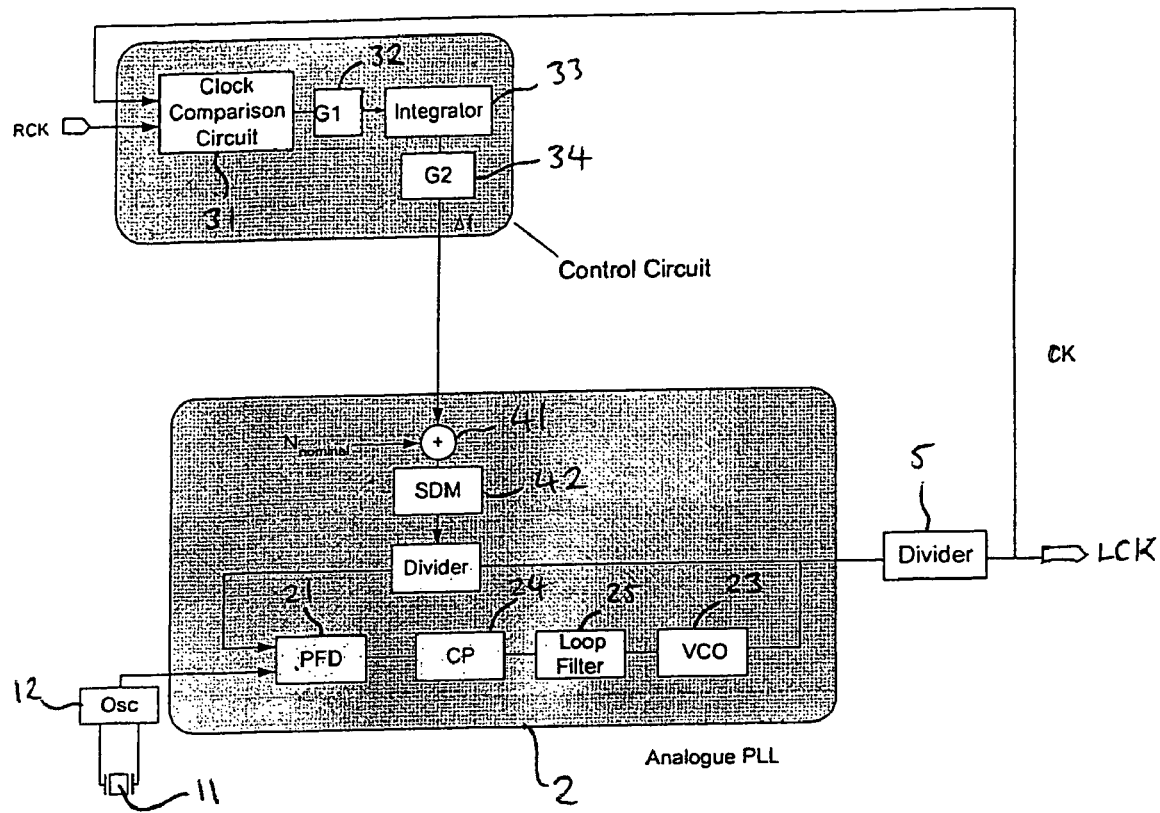
FIG. 4 is a schematic diagram of yet another embodiment.

FIG. 4 illustrates some further features of a possible implementation of the inventive clock synchroniser. The output from the integrator 33 is scaled as appropriate by $G_2$ (by gain block 34) and added to the nominal divide ratio using an adder 41. The adder output (the sum of the two digital signals) is typically input to a sigma delta modulator (SDM) 42 inside the APLL 2 to use noise shaping to achieve a fractional frequency multiplication with low APLL output jitter.

Also the APLL VCO 23 will typically run at a high frequency to allow low phase noise. As shown, the output system clock LCK will typically be divided down independently, using divider 5 as shown, for maximum resolution in frequency. To reduce hardware some of the stages of divider 5 and the feedback divider could be shared. But this would be equivalent to just having a reduced-frequency VCO which is undesirable as limiting resolution of the feedback divider. Although we are referring to the PLLs 2 in FIGS. 4 and 5 as analogue PLLs, they do incorporate digital phase detectors in the form of PFDs 21. These generate digital outputs. The digital phase detector outputs are used to control a charge pump (or pumps) 24, which in turn supply charge (current) to a loop filter 25. The loop filter integrates the supplied current and provides a control voltage to the VCO. The filter voltage, controlling the VCO, is thus a continuous (i.e. non-digital) control parameter, and it is for this reason that the circuits are referred to as APLLs.

Extension of the above algebraic analysis to FIG. 4 is straightforward to one versed in the art.

Figure 5:
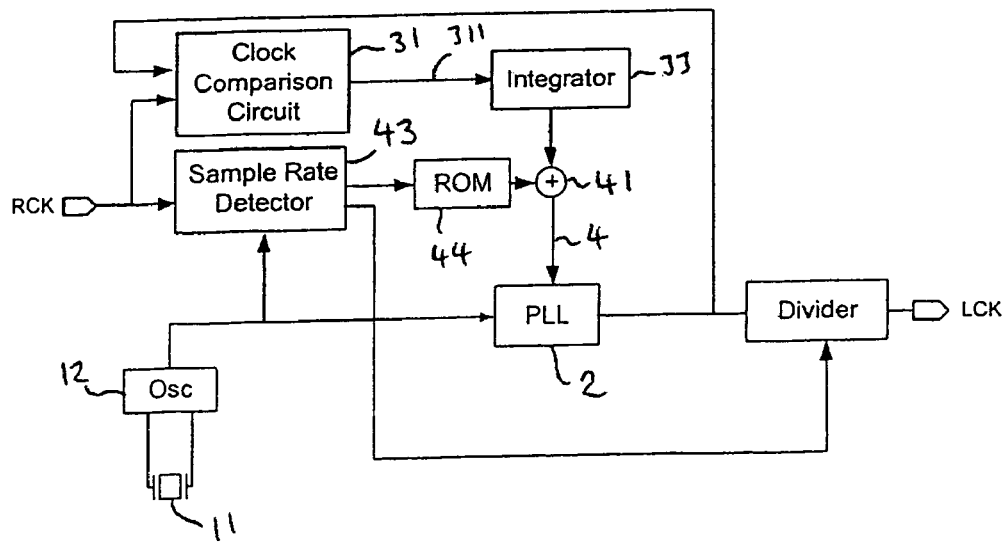
FIG. 5 is a schematic diagram of another clock synchroniser embodying the invention, adapted to reduce lock time and respond to abrupt changes in remote clock frequency.

FIG. 5 shows another embodiment, representing one possible implementation suitable for a system where the nominal clock frequency is uncertain, e.g. in digital audio systems where the input clock can be related to a base frequency of either 48 kHz or 44.1 kHz. A sample rate detector 43, incorporating a counter clocked from the known crystal frequency, provides a crude estimate of the input frequency (i.e. the received clock RCK frequency, and hence the remote clock frequency). This counter output is used by the control link circuitry to choose an approximate estimate for the nominal APLL divider ratio N, in this example by means of a memory (ROM 44) storing a set of appropriate values for anticipated possible input clock frequencies. This arrangement greatly reduces lock time, as well as allowing (and accommodating) abrupt changes in transmission clock frequency. The control circuitry is arranged such that the sample rate detector will usually only be used initially after a system reset, and the DFLL will track any subsequent frequency changes.

The accuracy to which this system can synchronise the clock is limited to the digital accuracy to which N can be specified. Hence the local clock frequency will hunt between the two closest possibilities. This will not result in data loss as long as the frequency difference is not enough to cause the local clock to jump between samples of the data.

It will be apparent that clock synchroniser circuits embodying the present invention can provide the following advantages:

they can generate clean local clock signal, suitable for low-distortion DACs, for example;

they can attenuate jitter on an incoming clock to very low frequency;

they can provide the above advantages without the need for large off chip filter components (reducing cost, and providing performance that is less sensitive to ground bounce etc);

the circuits can be implemented in small silicon areas in comparison to prior art circuits incorporating elastic buffers and large analogue components needed to achieve the same loop bandwidth; and unlike elastic buffer systems (requiring a large elastic buffer for each channel), only one clock synchroniser embodying the invention is required for a multiple channel application.

The skilled person will also appreciate that the various embodiments and specific features described with respect to them could be freely combined with the other embodiments or their specifically described features in general accordance with the above teaching. The skilled person will also recognise that various alterations and modifications can be made to specific examples described without departing from the scope of the appended claims.

The invention claimed is:

1. A clock synchroniser for generating a local clock signal synchronised to a received clock signal, comprising:

a reference oscillator arranged to provide a reference signal having a reference frequency;

a synthesiser circuit arranged to synthesise the local clock signal from the reference signal, the synthesiser circuit comprising a phase-locked-loop circuit including a phase detector, having a first input arranged to receive the reference signal, and a controllable divider arranged in a feedback path from a controlled oscillator to a second input of the phase detector, the divider being controllable to set a frequency division value N along said path to determine a ratio of a local clock frequency to the reference frequency wherein the phase locked loop circuit is a fractional-N phase locked loop circuit, the divider being controllable to achieve a non-integer average value of N;

a clock comparison circuit arranged to receive the local clock signal and a received clock signal, and adapted to generate a first digital signal indicative of an asynchronism between the local and remote clock signals; and a control link linking the clock comparison circuit to the divider, the control link being arranged to receive the first digital signal and to provide a control signal to the divider to adjust the frequency division value N according to the first digital signal to alter the local clock frequency and reduce the asynchronism.

2. The clock synchroniser in accordance with claim 1, wherein the control signal comprises said first digital signal.

3. The clock synchroniser in accordance with claim 1, wherein the control signal is dependent on the first digital signal.

4. The clock synchroniser in accordance with claim 3, wherein the divider is a digitally controlled divider, and said control signal is a digital control signal.

5. The clock synchroniser in accordance with claim 4, wherein the control link comprises an adder arranged to add the first digital signal, or a digital signal derived from the first digital signal, to a second digital signal, the digital control signal being dependent on the sum output from the adder.

6. The clock synchroniser in accordance with claim 5, wherein the control link comprises a sigma-delta modulator arranged to receive an output signal from the adder and generate said digital control signal.

7. The clock synchroniser in accordance with claim 1, wherein the control link further comprises a digital filter arranged to filter the first digital signal or a digital signal derived from the first digital signal to provide a signal indicative of an accumulated clock slippage.

8. The clock synchroniser in accordance with claim 1, wherein the reference oscillator comprises a crystal oscillator.

9. The clock synchroniser in accordance with claim 1, wherein the controlled oscillator is a voltage controlled oscillator.

10. The clock synchroniser in accordance with claim 1, wherein the phase detector is a digital phase detector, arranged to provide a digital phase signal dependent on a phase difference between the signals at its first and second inputs.

11. The clock synchroniser in accordance with claim 9, wherein the phase detector is a phase and frequency detector.

12. The clock synchroniser in accordance with claim 10, wherein the controlled oscillator is a voltage controlled oscillator, and the phase locked loop circuit comprises a filter and a charge pump, the charge pump being controlled by the digital phase signal to supply current to the filter, the filter being arranged to integrate the supplied current to provide a control voltage to the voltage controlled oscillator.

13. The clock synchroniser in accordance with claim 1, wherein the divider is arranged to divide an output signal from the controlled oscillator and to provide the divided signal to the second input of the phase detector.

14. The clock synchroniser in accordance with claim 1, wherein the synthesiser circuit comprises at least one further divider arranged to divide an output signal from the phase-locked-loop circuit to produce the local clock signal.

15. The clock synchroniser in accordance with claim 1, wherein the clock comparison circuit comprises a clock period detector arranged to generate said first digital signal, the first digital signal being a digital clock period signal indicative of a period difference between the local and received clock signals.

16. The clock synchroniser in accordance with claim 15, wherein the control link further comprises a digital filter arranged to integrate the digital clock period signal.

17. The clock synchroniser in accordance with claim 16, wherein the digital filter comprises a counter, arranged to be incremented or decremented according to the digital clock period signal, whereby the counter value is indicative of a slippage between the clock signals.

18. The clock synchroniser in accordance with claim 16, the control link further comprising a gain block, connected between the clock period detector and the filter to scale the digital clock period signal and provide the scaled signal to the filter.

19. The clock synchroniser in accordance with claim 16, wherein the control link comprises a gain block arranged to scale a signal output from the filter.

20. The clock synchroniser in accordance with claim 15, wherein the digital clock period signal is −1 or 0 or +1 according to the relative periods of the local and received clock signals.

21. The clock synchroniser in accordance with claim 20, comprising a counter arranged to integrate said digital clock period signal.

22. The clock synchroniser in accordance with claim 15, wherein the clock period detector comprises: a first counter arranged to receive the local clock signal; a second counter arranged to receive the received clock signal, the first and second counters each being further provided with a common clock signal having a frequency higher than the local clock signal; and a comparator arranged to generate a digital comparator output signal indicative of the relative values of the two counters.

23. The clock synchroniser in accordance with claim 22, wherein the digital comparator output signal is indicative of the magnitude of the difference between the two counter values.

24. The clock synchroniser in accordance with claim 22, wherein the common clock signal is provided from the phase-locked-loop circuit.

25. The clock synchroniser in accordance with claim 24, wherein the common clock signal is a signal divided from the output signal of the controlled oscillator.

26. The clock synchroniser in accordance with claim 22, wherein the digital comparator output signal is said first digital signal.

27. The clock synchroniser in accordance with claim 15, wherein the control link comprises a digital filter arranged to filter the digital clock period signal.

28. The clock synchroniser in accordance with claim 1, wherein the clock comparison circuit comprises a frequency detection circuit arranged to generate said first digital signal, the first digital signal being indicative of a frequency difference between the local and received clock signals.

29. The clock synchroniser in accordance with claim 28, wherein the frequency detection circuit comprises a cycle comparator circuit arranged to compare respective numbers of local and received clock cycles in a common time interval to provide an indication of frequency difference.

30. The clock synchroniser in accordance with claim 1, wherein the clock comparison circuit comprises a clock phase detector adapted to generate said first digital signal, the first digital signal being a digital clock phase signal indicative of a difference between the clock phases of the local and received clock signals.

31. The clock synchroniser in accordance with claim 1, wherein the control link is adapted to control the divider to set an initial frequency division value.

32. The clock synchroniser in accordance with claim 31, wherein the control link comprises a rate detector arranged to generate a digital rate signal indicative of an approximate value of the received clock frequency, the control link being further arranged to set the initial frequency division value according to the digital rate signal.

33. The clock synchroniser in accordance with claim 32, wherein the control link comprises a memory storing data indicative of respective N values appropriate for a plurality of possible received clock frequencies, and is adapted to select said data according to the digital rate signal and set the initial frequency division value according to the selected data.

34. The clock synchroniser in accordance with claim 32, wherein the rate detector is arranged to receive the received clock signal and a further clock signal derived from the reference oscillator.

35. The clock synchroniser in accordance with claim 1, further comprising a clock extractor circuit, arranged to receive a data signal containing a clock signal, and adapted to extract the clock signal and provide it to the clock comparison circuit as the received clock signal.

36. The clock synchroniser in accordance with claim 1, wherein the control link comprises an integrator arranged to integrate the first digital signal or a digital signal derived from the first digital signal.

37. The clock synchroniser in accordance with claim 1, wherein the control link comprises a digital filter arranged to filter the first digital signal or a digital signal derived from the first digital signal, such that the control link, the synchronizer circuit and the clock comparison circuit form a low bandwidth control loop.

38. The clock synchroniser in accordance with claim 1, wherein the control link comprises a sigma-delta modulator arranged to receive the first digital signal or a digital signal derived from the first digital signal and to generate said control signal.

39. The clock synchroniser in accordance with claim 1, wherein a loop bandwidth, of a loop comprising: the synthesiser circuit; the clock comparison circuit; and the control link, can be temporarily increased.

40. The clock synchroniser in accordance with claim 39, wherein the control link comprises a gain block operable to scale the first digital signal or a digital signal derived from the first digital signal by a gain value, wherein the gain value is increasable to increase said loop bandwidth.

41. A method of generating a local clock signal synchronised to a received clock signal, comprising the steps of:
  generating a reference signal having a reference frequency using a local oscillator;
  synthesizing a local clock signal from the reference signal using a phase-lock-loop circuit including a controllable divider arranged in a feedback loop, the divider being controlled to set a frequency division value N along the feedback loop to control a ratio of a local clock frequency to the reference frequency, wherein the phase locked loop circuit is a fractional-N phase locked loop circuit, the divider being controllable to achieve a non-integer average value of N;
  using a clock comparison circuit for receiving the local clock signal and the received clock signal, and generating a digital signal indicative of an asynchronism between the local clock signal and the received clock signal; and
  using a control link linking the clock comparison circuit to the divider to receive the digital signal and to control the divider to adjust the frequency division value N according to the first digital signal to alter the local clock frequency to reduce the asynchronism.

42. The method in accordance with claim 41, wherein the step of generating the digital signal comprises generating a digital signal indicative of a period difference between the clock signals.

43. The method in accordance with claim 41, wherein the step of using the digital signal comprises integrating the digital signal and using the integrated digital signal to control the divider.

44. The method in accordance with claim 41, wherein the step of using the digital signal comprises performing sigma-delta modulation on said digital signal, or on a digital signal derived from said digital signal, and using the sigma-delta modulated signal to control the divider.

45. The method in accordance with claim 41, wherein the loop has a loop bandwidth, further comprising the steps of:
  controlling the divider to adjust the local clock frequency; generating said digital signal; and using said digital signal to control the divider, and the said steps are performed with the loop bandwidth temporarily increased relative to a bandwidth at which said steps are subsequently performed.

46. The method in accordance with claim 45, wherein the step of using the digital signal to control the divider comprises the step of scaling said digital signal, or a digital signal derived therefrom, by a gain value, said gain value being temporarily increased to temporarily increase said loop bandwidth.

47. A circuit for generating a local clock signal at a frequency determined by a received clock signal, comprising:
  a phase-locked-loop for generating said local clock signal, said phase-locked-loop comprising: a controlled oscillator for generating said local clock signal or a clock signal to be frequency-divided to form said local clock signal; a feedback path including a controllable divider for receiving the clock signal generated by the controlled oscillator, or a signal derived therefrom, and for processing it to create a feedback signal, said processing comprising frequency division by a factor N in the controllable divider; and a phase detector for receiving a reference clock signal and said feedback signal and detecting their relative phase, an output from the phase detector being coupled to a control input of the controlled oscillator to control the frequency of the clock signal output from the controlled oscillator in accordance with the detection result of the phase detector wherein the phase locked loop circuit is a fractional-N phase locked loop circuit, the divider being controllable to achieve a non-integer average value of N;
  a comparator for comparing the local clock signal with said received clock signal and providing a digital signal having a value in accordance with an asynchronism between them; and a control link for receiving said digital signal and providing a control signal, derived at least in part from the value of said digital signal, to the controllable divider of the phase-locked-loop for controlling the factor N of said controllable divider.

48. The circuit in accordance with claim 47, wherein said asynchronism is a frequency difference.

49. The circuit in accordance with claim 47, wherein said asynchronism is a phase difference.

50. The circuit in accordance with claim 47, wherein said phase-locked-loop comprises a filter, and said output of the phase detector is coupled to said control input of said controlled oscillator through said filter.

51. The circuit in accordance with claim 47, wherein said control link comprises a digital filter operable to filter said digital signal or a digital signal derived therefrom.

52. The circuit in accordance with claim 47, comprising a sigma-delta modulator connected to receive the control signal, modulate it by sigma-delta modulation, and provide the modulated signal to the controllable divider.

53. The circuit in accordance with claim 47, arranged to enable a loop bandwidth, of a loop comprising the phase-locked-loop, the comparator and the control link, to be temporarily increased.

54. The circuit in accordance with claim 53, wherein the control link comprises a block operable to scale the value of the digital signal, or a signal derived therefrom, by a gain value, said block being arranged to enable said gain value to be temporarily increased.

* * * * *

UNITED STATES PATENT AND TRADEMARK OFFICE
CERTIFICATE OF CORRECTION

PATENT NO. : 7,583,774 B2  Page 1 of 1
APPLICATION NO. : 10/986994
DATED : September 1, 2009
INVENTOR(S) : Paul Lesso It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1163 days.

Signed and Sealed this

Fourteenth Day of September, 2010

David J. Kappos
*Director of the United States Patent and Trademark Office*